US012805100B2

(12) United States Patent
Yang et al.

(10) Patent No.: US 12,805,100 B2
(45) Date of Patent: Nov. 17, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Guoqiang Yang, Wuhan (CN); Liliang Gong, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 360 days.

(21) Appl. No.: 18/548,364

(22) PCT Filed: Jul. 19, 2023

(86) PCT No.: PCT/CN2023/108132
§ 371 (c)(1),
(2) Date: Aug. 30, 2023

(87) PCT Pub. No.: WO2024/254938
PCT Pub. Date: Dec. 19, 2024

(65) Prior Publication Data

US 2025/0113687 A1 Apr. 3, 2025

(30) Foreign Application Priority Data

Jun. 16, 2023 (CN) ......................... 202310726360.9

(51) Int. Cl.
*H10H 29/41* (2025.01)
*H10H 29/855* (2025.01)

(52) U.S. Cl.
CPC .......... *H10H 29/41* (2025.01); *H10H 29/855* (2025.01)

(58) Field of Classification Search
CPC .... H10H 29/41; H10H 29/855; H10K 59/124; H10K 59/122
See application file for complete search history.

(56) References Cited

U.S. PATENT DOCUMENTS 6,482,419 B1 * 11/2002 Miyazaki .............. C09C 1/0021 424/490
2012/0175615 A1 7/2012 You
(Continued)

FOREIGN PATENT DOCUMENTS

CN 113745256 A 12/2021
CN 114256437 A 3/2022
(Continued)

OTHER PUBLICATIONS

International Search Report in International application No. PCT/CN2023/108132, mailed on Jan. 16, 2024.
(Continued)

*Primary Examiner* — Eric K Ashbahian
(74) *Attorney, Agent, or Firm* — PV IP PC; Christopher S. Ruprecht; Wei Te Chung

(57) ABSTRACT

A display panel and a display device are provided by the present application. The display panel includes a substrate, an inorganic insulating layer, a plurality of pixel-driving circuits, an organic insulating layer, and a light-emitting layer. The organic insulating layer is disposed on a side of the inorganic insulating layer away from the substrate, and the light-emitting layer is disposed on a side of the organic insulating layer away from the substrate. The inorganic insulating layer includes a first inorganic insulating sub-layer, and a refractive index of the first inorganic insulating
(Continued)

sub-layer is less than refractive index of the organic insulating layer.

19 Claims, 7 Drawing Sheets

(56) References Cited

U.S. PATENT DOCUMENTS

| | | | | |
|---|---|---|---|---|
| 2022/0052125 A1* | 2/2022 | Choi | H04M 1/0266 | |
| 2022/0077425 A1* | 3/2022 | Lee | H10K 59/873 | |
| 2023/0105200 A1* | 4/2023 | Zou | H10K 59/879 | 257/71 |
| 2023/0139303 A1* | 5/2023 | Kwon | H10K 59/38 | 257/129 |
| 2023/0284475 A1* | 9/2023 | Oh | H10K 59/873 | |
| 2024/0423040 A1* | 12/2024 | Shin | H10K 39/34 | |

FOREIGN PATENT DOCUMENTS

| | | |
|---|---|---|
| CN | 115148929 A | 10/2022 |
| CN | 115425050 A | 12/2022 |
| CN | 218851231 U | 4/2023 |

OTHER PUBLICATIONS

Written Opinion of the International Search Authority in International application No. PCT/CN2023/108132, mailed on Jan. 16, 2024.

Chinese Office Action issued in corresponding Chinese Patent Application No. 202310726360.9 dated Sep. 11, 2026, pp. 1-8.

* cited by examiner

DISPLAY PANEL AND DISPLAY DEVICE

TECHNICAL FIELD

The present application relates to a technical field of display, and in particular to a display panel and a display device.

BACKGROUND

With people's pursuit of visual experience in display, it is necessary to increase a screen proportion of a display area as much as possible, which requires hiding a front-facing camera above screen below the screen. For the front-facing camera, sufficient light input is required to ensure an imaging effect, so for a display panel, an imaging area needs to have a sufficiently high transmittance.

For an area of the display panel corresponding to the camera, light is prone to interference and reflection at different films, which leads to reflection and interference at an interface when the light passes through, resulting in a low transmittance of the screen and affecting the imaging effect of the camera.

SUMMARY

A display panel and a display device are provided by embodiments of the present application, aiming at solving a problem of a low light transmittance in a display panel area corresponding to a camera in prior art.

To solve above problems, in a first aspect, the present application provides a display panel.

The display panel includes a first display area and a second display area, and a light transmittance of the first display area is greater than a light transmittance of the second display area.

The display panel further includes:

a substrate;

an inorganic insulating layer, disposed on a side of the substrate;

a plurality of pixel-driving circuits, disposed on the inorganic insulating layer and comprising a plurality of first pixel-driving circuits disposed in the first display area or the second display area and a plurality of second pixel-driving circuits disposed in the second display area;

an organic insulating layer, disposed on a side of the inorganic insulating layer away from the substrate; and a light-emitting layer, disposed on a side of the organic insulating layer away from the substrate and including a plurality of first light-emitting pixels disposed in the first display area and a plurality of second light-emitting pixels disposed in the second display area, the first pixel-driving circuits are electrically connected with the first light-emitting pixels, and the second pixel-driving circuits are electrically connected with the second light-emitting pixels;

the inorganic insulating layer includes a first inorganic insulating sub-layer, and a refractive index of the first inorganic insulating sub-layer is less than a refractive index of the substrate and less than a refractive index of the organic insulating layer.

In some possible embodiments, the inorganic insulating layer further includes:

a second inorganic insulating sub-layer, disposed between the first inorganic insulating sub-layer and the organic insulating sub-layer, and a refractive index of the second inorganic insulating sub-layer is greater than the refractive index of the first inorganic insulating sub-layer.

In some possible embodiments, the refractive index of the second inorganic insulating sub-layer is greater than the refractive index of the substrate and the refractive index of the organic insulating layer.

In some possible embodiments, the inorganic insulating layer further includes:

a third inorganic insulating sub-layer, disposed between the second inorganic insulating sub-layer and the organic insulating sub-layer, and a refractive index of the third inorganic insulating sub-layer is less than the refractive index of the substrate, the refractive index of the second inorganic insulating sub-layer, and the refractive index of the organic insulating layer.

In some possible embodiments, a thickness of the third inorganic insulating sub-layer is less than a thickness of the first inorganic insulating sub-layer.

In some possible embodiments, the inorganic insulating layer further includes:

a fourth inorganic insulating sub-layer, disposed between the third inorganic insulating sub-layer and the organic insulating sub-layer, and a refractive index of the fourth inorganic insulating sub-layer is greater than the refractive index of the first inorganic insulating sub-layer and the refractive index of the third inorganic insulating sub-layer.

In some possible embodiments, the refractive index of the fourth inorganic insulating sub-layer is less than the refractive index of the substrate, and greater than the refractive index of the organic insulating layer.

In some possible embodiments, the refractive index of the first inorganic insulating sub-layer and the refractive index of the third inorganic insulating sub-layer are identical, and the refractive index of the second inorganic insulating sub-layer and the refractive index of the fourth inorganic insulating sub-layer are identical.

In some possible embodiments, the inorganic insulating layer further includes a fifth inorganic insulating sub-layer disposed between the fourth inorganic insulating sub-layer and the organic insulating layer.

In some possible embodiments, the inorganic insulating layer includes: one or more low-refractive-index inorganic insulating sub-layers and one or more high-refractive-index inorganic insulating sub-layers alternately stacked, the low-refractive-index inorganic insulating sub-layers are disposed adjacent to the substrate, and a refractive index of the high-refractive-index inorganic insulating sub-layer is greater than a refractive index of the low-refractive-index inorganic insulating sub-layer adjacent to the high-refractive-index inorganic insulating sub-layer;

a thickness of the low-refractive-index inorganic insulating sub-layer satisfies a following formulas: $d=(2k-1)\lambda/(4n)$;

where k is a positive integer, and a value of k is determined according to a number of layers of the low-refractive-index inorganic insulating sub-layers along a direction from the organic insulating layer to the substrate; $\lambda$ is a wavelength of light and n is a refractive index.

In a second aspect, the embodiments of the present application provide a display device, including a sensor and a display panel, the display panel includes a first display area and a second display area, and a light transmittance of the first display area is greater than a light transmittance of the second display area;

the display panel further includes:

a substrate;

an inorganic insulating layer, disposed on a side of the substrate;

pixel-driving circuits, disposed in the inorganic insulating layer and comprising a plurality of first pixel-driving circuits disposed in the first display area or the second display area and a plurality of second pixel-driving circuits disposed in the second display area;

an organic insulating layer, disposed on a side of the inorganic insulating layer away from the substrate; and a light-emitting layer, disposed on a side of the organic insulating layer away from the substrate and including a plurality of first light-emitting pixels disposed in the first display area and a plurality of second light-emitting pixels disposed in the second display area, the first pixel-driving circuits are electrically connected with the first light-emitting pixels, and the second pixel-driving circuits are electrically connected with the second light-emitting pixels;

the inorganic insulating layer includes a first inorganic insulating sub-layer, and a refractive index of the first inorganic insulating sub-layer is less than a refractive index of the substrate and less than a refractive index of the organic insulating layer;

the sensor is disposed corresponding to the first display area of the display panel.

In some possible embodiments, the inorganic insulating layer further includes:

a second inorganic insulating sub-layer, disposed between the first inorganic insulating sub-layer and the organic insulating sub-layer, and a refractive index of the second inorganic insulating sub-layer is greater than the refractive index of the first inorganic insulating sub-layer.

In some possible embodiments, the refractive index of the second inorganic insulating sub-layer is greater than the refractive index of the substrate, and greater than the refractive index of the organic insulating layer.

In some possible embodiments, the inorganic insulating layer further includes:

a third inorganic insulating sub-layer, disposed between the second inorganic insulating sub-layer and the organic insulating sub-layer, and a refractive index of the third inorganic insulating sub-layer is less than the refractive index of the substrate, the refractive index of the second inorganic insulating sub-layer, and the refractive index of the organic insulating layer.

In some possible embodiments, a thickness of the third inorganic insulating sub-layer is less than a thickness of the first inorganic insulating sub-layer.

In some possible embodiments, the inorganic insulating layer further includes:

a fourth inorganic insulating sub-layer, disposed between the third inorganic insulating sub-layer and the organic insulating sub-layer, and a refractive index of the fourth inorganic insulating sub-layer is greater than the refractive index of the first inorganic insulating sub-layer and the refractive index of the third inorganic insulating sub-layer.

In some possible embodiments, the refractive index of the fourth inorganic insulating sub-layer is less than the refractive index of the substrate, and greater than the refractive index of the organic insulating layer.

In some possible embodiments, the refractive index of the first inorganic insulating sub-layer and the refractive index of the third inorganic insulating sub-layer are identical, and the refractive index of the second inorganic insulating sub-layer and the refractive index of the fourth inorganic insulating sub-layer are identical.

In some possible embodiments, the inorganic insulating layer further includes a fifth inorganic insulating sub-layer disposed between the fourth inorganic In some possible embodiments, the inorganic insulating layer includes: one or more low-refractive-index inorganic insulating sub-layers and one or more high-refractive-index inorganic insulating sub-layers alternately stacked, the low-refractive-index inorganic insulating sub-layers are disposed adjacent to the substrate, and a refractive index of the high-refractive-index inorganic insulating sub-layer is greater than a refractive index of the low-refractive-index inorganic insulating sub-layer adjacent to the high-refractive-index inorganic insulating sub-layer;

a thickness of the low-refractive-index inorganic insulating sub-layer satisfies a following formulas: $d=(2k-1)\lambda/(4n)$;

where k is a positive integer, and a value of k is determined according to a number of layers of the low-refractive-index inorganic insulating sub-layers along a direction from the organic insulating layer to the substrate; $\lambda$ is a wavelength of light and n is a refractive index.

A display panel and a display device are provided by the present application. The display panel includes a first display panel and a second display panel. A light transmittance of the first display area is greater than a light transmittance of the second display area. The display panel further includes a substrate, an inorganic insulating layer, an organic insulating layer, and a light-emitting layer. The inorganic insulating layer includes a first inorganic insulating sub-layer. A refractive index of the first inorganic insulating sub-layer is less than a refractive index of the substrate and less than a refractive index of the organic insulating layer. By disposing film layers stacking mechanisms with different refractive indices to improve a light transmittance in the present application, thereby improving an imaging effect of the display panel.

BRIEF DESCRIPTION OF THE DRAWINGS

To describe the technical solutions of the embodiments of the present application more clearly, the following briefly introduces the accompanying drawings used in the description of the embodiments of the present application. The accompanying drawings described below illustrate only some exemplary embodiments of the present application, and persons skilled in the art may derive other drawings from the drawings without making creative efforts.

DETAILED DESCRIPTION

Figure 1:
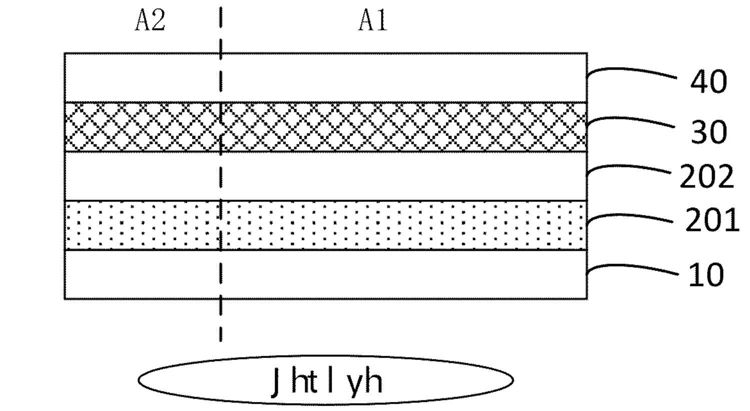
FIG. 1 is a cross-sectional diagram of an embodiment of a display panel provided by an embodiment of the present application.

The present application is described in detail below with reference to the accompanying drawings and specific embodiments. Apparently, the described embodiments are merely a part of but not all embodiments of the present application. All other embodiments obtained by persons of ordinary skill in the art based on the embodiments of the present application without creative efforts shall fall within a protection scope of the present application.

In the description of the present application, it should be understood that terms such as "center," "lateral," "longitudinal," "length," "width," "thickness," "up," "down," "front," "rear," "up," "left," "right," "vertical," "horizontal," "top," "bottom," "inside," "outside," as well as derivative thereof should be construed to refer to the orientation as then described or as shown in the drawings under discussion. These relative terms are for convenience of description, do not require that the present application be constructed or operated in a particular orientation, and shall not be construed as causing limitations to the present application. In addition, terms such as "first" and "second" are used herein for purposes of description and are not intended to indicate or imply relative importance or significance. Thus, features limited by "first", and "second". are intended to indicate or imply including one or more than one these features. In the description of the present application, "a plurality of" relates to two or more than two, unless otherwise specified. In addition, the term "including" and any variations thereof are intended to cover non-exclusive inclusion.

In this present application, the term "exemplary" is used to mean "serving as an example, illustration or illustration". Any embodiment described in the present application as "exemplary" is not necessarily construed as being more preferred or advantageous than other embodiments. The following description is given to enable any person skilled in the art to practice and use the present application. In the following description, the details are listed for the purpose of explanation. It should be understood that one of ordinary skill in the art will recognize that the present application may be practiced without the use of these specific details. In other examples well-known structures and processes will not be elaborated in detail to avoid unnecessary details that obscure the description of the present application. Accordingly, the present application is not intended to be limited to the embodiments shown but is consistent with the widest scope consistent with the principles and features disclosed herein.

The embodiments of the present application provide a display panel and a display device. The following are described in detail.

As shown in FIG. 1, FIG. 1 is a cross-sectional diagram of an embodiment of a display panel provided by an embodiment of the present application. The display panel includes a first display area A1 and a second display area A2. A light transmittance of the first display area A1 is greater than a light transmittance of the second display area A2. In a specific embodiment, the first display area A1 and the second display area A2 may correspond to an under-screen camera area in the display panel. The under-screen camera area is an area corresponding to an under-screen camera, and the under-screen camera area is divided into a light-transmission area and a light-shielding area. The light-shielding area is mainly an area corresponding to thin film transistors in the display panel, which is the second display area A2. The light-transmitting area is the first display area A1 without the thin film transistors. Light mainly passes through the light-transmitting area to enter the under-screen camera. The present application mainly aims at increasing the light transmittance of the light transmission area, that is, the first display area A1.

In FIG. 1, the display panel further includes a substrate 10, an inorganic insulating layer 20, pixel-driving circuits, an organic insulating layer 30, and a light-emitting layer 40. The inorganic insulating layer 20 is disposed on a side of the substrate 10. The pixel-driving circuits disposed in the inorganic insulating layer 20, and the pixel-driving circuits include a plurality of first pixel-driving circuits disposed in the first display area A1 or the second display area A2, and a plurality of second pixel-driving circuits disposed in the second display area A2. The organic insulating layer 30 is disposed on a side of the inorganic insulating layer 20 away from the substrate 10. The light-emitting layer 40 is disposed on a side of the organic insulating layer 30 away from the substrate 10, and the light-emitting layer 40 includes a plurality of first light-emitting pixels disposed in a first display area A1 and a plurality of second light-emitting pixels disposed in a second display area A2. The first pixel-driving circuits are electrically connected to the first light-emitting pixels, and the second pixel-driving circuits are electrically connected to the second light-emitting pixels.

In the embodiments above-mentioned, the inorganic insulating layer 20 includes a first inorganic insulating sub-layer 201. A refractive index of the first inorganic insulating sub-layer 201 is less than a refractive index of the substrate and less than a refractive index of the organic insulating layer. In this way, the substrate 10, the inorganic insulating layer 20, and the organic insulating layer 30 stacked in the display panel to form a structure in which each layer has a different refractive index. Low refractive index films and high refractive index films are disposed adjacent to each other. The low refractive index films are used as an anti-reflection film of the high refractive index films to enhance the light transmittance, thereby effectively improving a screen transmittance of the under-screen camera area.

Figure 2:
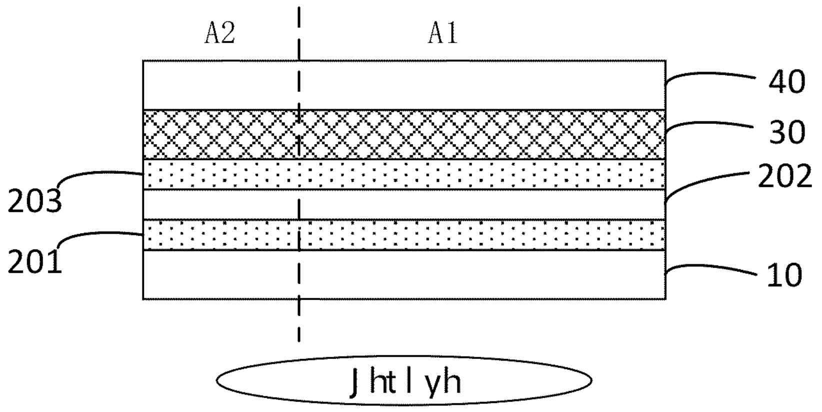
FIG. 2 is a structural schematic diagram of another embodiment of the display panel provided by an embodiment of the present application.

In other embodiments, the inorganic insulating layer 20 may further include a second inorganic insulating sub-layer 202. As shown in FIG. 2, FIG. 2 is a structural schematic diagram of another embodiment of the display panel provided by an embodiment of the present application. The second inorganic insulating sub-layer 202 is disposed between the first inorganic insulating sub-layer 201 and the organic insulating sub-layer 30. A refractive index of the second inorganic insulating sub-layer 202 is greater than the refractive index of the first inorganic insulating sub-layer 201. Meanwhile, the refractive index of the second inorganic insulating sub-layer 202 is greater than the refractive index of the substrate 10, and further greater than the refractive index of the organic insulating layer 30.

Continue to refer to FIG. 2, The inorganic insulating layer 20 may further include a third inorganic insulating sub-layer 203 disposed between the second inorganic insulating sub-layer 202 and the organic insulating sub-layer 30. A refractive index of the third inorganic insulating sub-layer 203 is less than the refractive index of the substrate 10 and the refractive index of the second inorganic insulating sub-layer 202, and the refractive index of the organic insulating layer 30.

Figure 3:
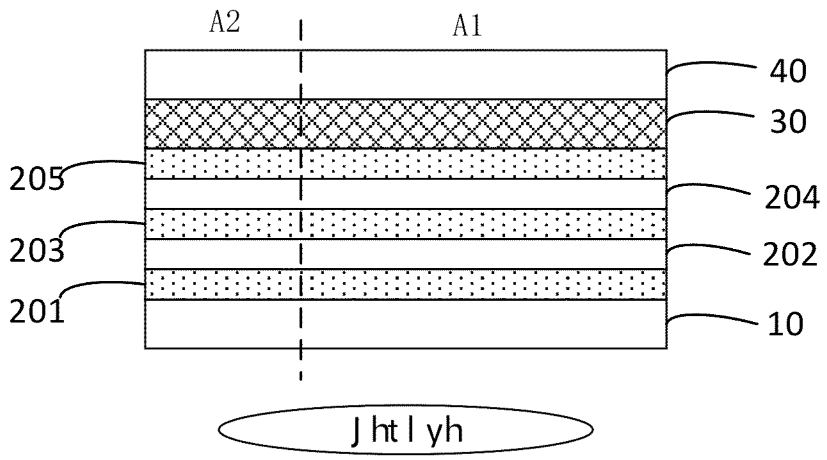
FIG. 3 is a structural schematic diagram of another embodiment of the display panel provided by an embodiment of the present application.

As shown in FIG. 3, FIG. 3 is a structural schematic diagram of another embodiment of the display panel provided by an embodiment of the present application. The inorganic insulating layer 20 further includes a fourth inorganic insulating sub-layer 204 disposed between the third inorganic insulating sub-layer 203 and the organic insulating sub-layer 30. The refractive index of the fourth inorganic insulating sub-layer 204 is greater than the refractive index of the first inorganic insulating sub-layer 201 and the refractive index of the third inorganic insulating sub-layer 203. And the refractive index of the fourth inorganic insulating sub-layer 204 is less than the refractive index of the substrate 10, and further greater than the refractive index of the organic insulating layer 30.

Continue to refer to FIG. 3. The inorganic insulating layer 20 further includes a fifth inorganic insulating sub-layer 205 disposed between the fourth inorganic insulating sub-layer 204 and the organic insulating layer 30. A refractive index of the fifth inorganic insulator sub-layer 205 is less than the refractive index of the substrate 10, and further less than the refractive index of the organic insulating layer 30. The refractive index of the fifth inorganic insulator sub-layer 205 is further less than the refractive index of the fourth inorganic insulating layer 204.

Figure 4:
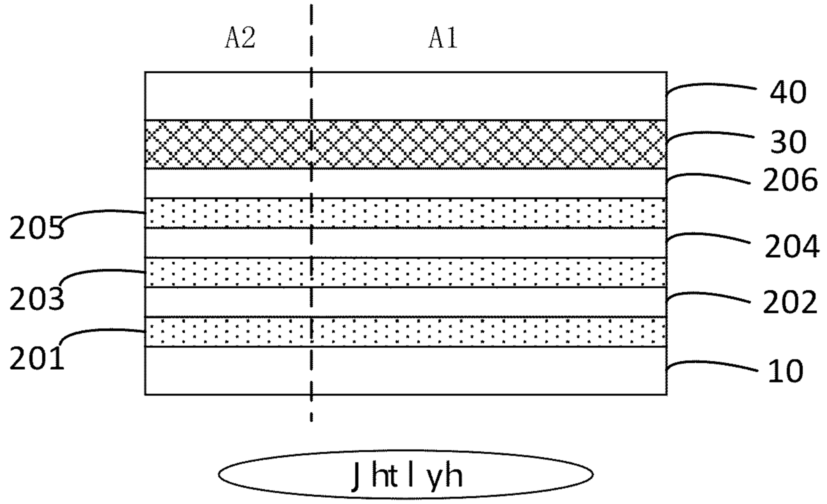
FIG. 4 is a structural schematic diagram of another embodiment of the display panel provided by an embodiment of the present application.

As shown in FIG. 4, FIG. 4 is a structural schematic diagram of another embodiment of the display panel provided by an embodiment of the present application. The inorganic insulating layer 30 may further include a sixth inorganic insulating sub-layer 206 disposed between the fifth inorganic insulating sub-layer 205 and the organic insulating layer 30.

In the embodiments above-mentioned, the refractive index of the first inorganic insulating sub-layer 201, the refractive index of the third inorganic insulating sub-layer 203, and the refractive index of the fifth inorganic insulating sub-layer 205 may be in a same refractive index range. In one specific embodiment, the refractive indices of the three may be the same. The refractive index of the second inorganic insulating sub-layer 202, the refractive index of the fourth inorganic insulating layer 204, and the refractive index of the sixth inorganic insulating layer 206 may be in a same refractive index range. In one specific embodiment, the refractive indices of the three may be same. In the present application, the first inorganic insulating sub-layer 201, the third inorganic insulating sub-layer 203, and the fifth inorganic insulating layer 205 may be made of the same material, e.g. silicon oxide material. The refractive index of the second inorganic insulating sub-layer 202, the fourth inorganic insulating sub-layer 204, and the sixth inorganic insulating sub-layer 206 may be made of the same material, e.g. silicon oxide material.

In the embodiments above-mentioned, materials of the different inorganic insulating sub-layers may be same, but thicknesses of the different insulating sub-layers are different. In particular, a thickness of the third inorganic insulating sub-layer is less than a thickness of the first inorganic insulating sub-layer.

Figure 5:
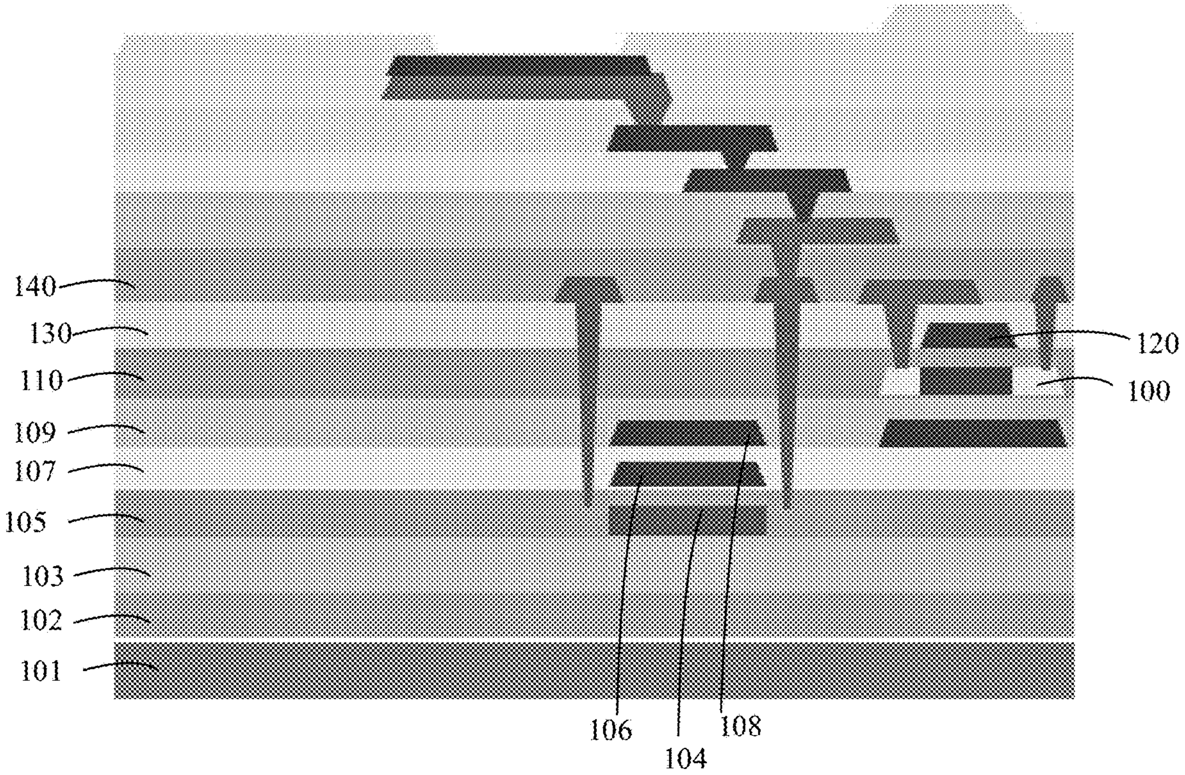
FIG. 5 is a structural schematic diagram of another embodiment of the display panel provided by an embodiment of the present application.

It should be noted that, in the embodiments of the present application, a plurality of inorganic insulating sub-layers in the inorganic insulating layer 20 are actually prepared by means of existing functional film layers in the display panel without adding an additional process. For example, the inorganic insulating layer may be a gate insulating layer, a planarization layer, and the like in the display panel. An actual structure of the display panel is explained below:

As shown in FIG. 5, FIG. 5 is a structural schematic diagram of another embodiment of the display panel provided by an embodiment of the present application. The display panel further includes a base substrate layer 101, a multiple barrier layer 102, and a buffer layer 103, an active layer 104 disposed on the buffer layer 103, a first insulating layer 105 disposed on the active layer 104 and completely covering the active layer 104, a first gate layer 106 disposed on the first insulating layer 105, a second insulating layer 107 disposed on the first gate layer 106 and completely covering the first gate layer 106, and a second gate layer 108 disposed on the second insulating layer 107. The display panel further includes a first interlayer dielectric layer 109 disposed on the second gate layer 108. An oxide semiconductor layer 100 is further disposed on the first interlayer dielectric layer 109, and a third insulating layer 110 is formed above the oxide semiconductor layer 100, and the third insulating layer 110 completely covers the oxide semiconductor layer 100. A third gate layer 120 is further formed at a position corresponding to the oxide semiconductor layer 100 on the third insulating layer 110. A second interlayer dielectric layer 130 is formed on the third gate layer 120 and the second interlayer dielectric layer 130 completely covers the third gate layer 120. As illustrated in FIG. 5, via holes are used to form respective source-drain layers of two thin film transistors. On another hand, a planarization layer 140 is formed on and completely covers the two source-drain layers, and the second interlayer dielectric layer 130 to planarize an upper surface of the display panel.

Figure 6:
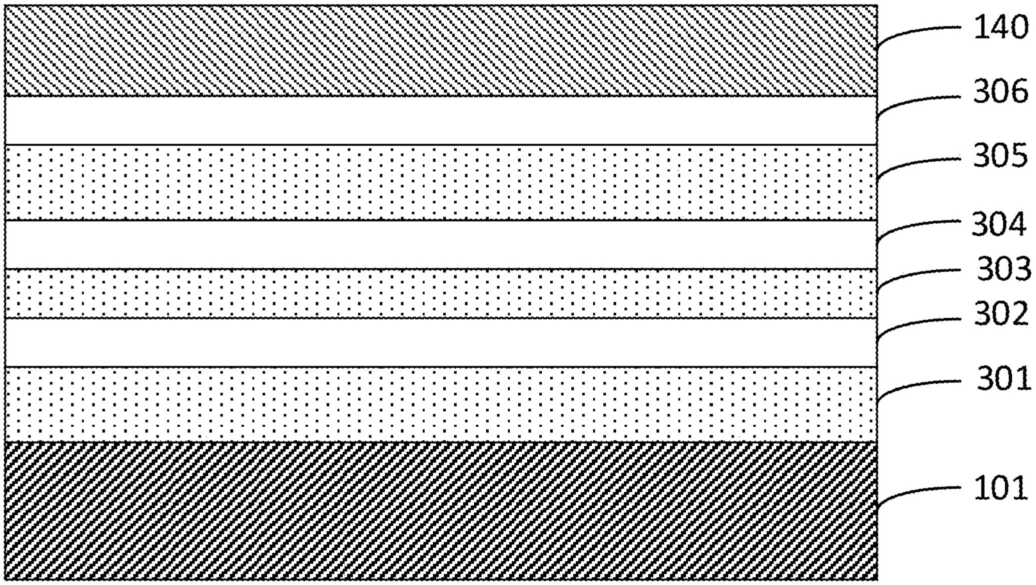
FIG. 6 is a structural schematic diagram of another embodiment of the display panel provided by an embodiment of the present application.

As shown in FIG. 6, FIG. 6 is a structural schematic diagram of another embodiment of the display panel provided by an embodiment of the present application. In the embodiment shown FIG. 6, the display panel includes the base substrate layer 101, the inorganic insulating layer, and the planarization layer 140 which are stacked. The embodiment shown in FIG. 6 is a simplified schematic diagram of the display panel structure, and technical solutions of the present application will be described below in conjunction with FIG. 5 and FIG. 6.

FIG. 5 simplifies the display panel structure shown in FIG. 6 to obtain a display panel including the base substrate layer 101, the inorganic insulating layer, and a planarization layer 140 which are stacked. The base substrate layer 101 is equivalent to the substrate 10 in FIGS. 1-4. The planarization layer 140 is similar to the organic insulating layer 30 in FIGS. 1-4. Layers located in the base substrate layer 101 and the planarization layer 140 are the inorganic insulating layer and the pixel-driving circuits disposed between the inorganic insulating layer. Therefore, the inorganic insulating layer in the present application includes a multilayer structure such as the multiple barrier layer 102, a buffer layer 103, a first gate layer 106, etc. in FIG. 1. The details are as follows:

In some embodiments of the present application, the inorganic insulating layer may be a multi-film layer structure, and the inorganic insulating layer may specifically include silicon nitride layers and silicon oxide layers disposed cross-stacked. Taking the embodiment shown in FIG. 6 as an example, the inorganic insulating layer may include a first silicon oxide layer 301, a first silicon nitride layer 302, a first silicon oxide layer 303, a second silicon nitride layer 304, a third silicon oxide layer 305, and a third silicon nitride layer 306 which are stacked from bottom to top. The first silicon oxide layer is disposed on and in direct contact with the base substrate layer 101, and the planarization layer is disposed on the third silicon nitride layer 306. A plurality of silicon oxide layers and a plurality of silicon nitride layers stacked here are similar to the plurality of inorganic insulating layers in FIG. 1 to FIG. 4.

In the embodiment shown in FIG. 6, a plurality of film layer structures between the base substrate layer 101 and the first planarization layer in FIG. 5 are divided into a plurality of silicon nitride layers and a plurality of silicon oxide layers which are cross-stacked according to different preparation materials. Specifically, taking the multiple barrier layer 102 located on and in direct contact with the base substrate layer 101 as an example, a preparation material of the multiple barrier layer 102 is typically silicon dioxide (SiO2) and silicon nitride (SiNx), and a preparation material of the buffer layer 103 located on the multiple barrier layer 102 also include silicon dioxide and silicon nitride. When the multiple barrier layer 102 is prepared, silicon nitride is prepared above silicon dioxide. When the buffer layer 103 is prepared, silicon dioxide is prepared over silicon nitride. At this time, the silicon nitride in the multiple barrier layer 102 and the silicon nitride in the buffer layer 103 are in a direct contact, so that the silicon nitride in the multiple barrier layer 102 and the silicon nitride in the buffer layer 103 may be regarded as a same layer structure, and the first silicon nitride layer 302 is obtained. At this time, the film layers are divided again according to the preparation materials of the film layers.

Since the insulating layer, the interlayer dielectric layer, and the like in the present application are all made of silicon oxide and silicon nitride materials, other film layers except the active layer, the gate layer, and the oxide semiconductor layer may be divided twice to obtain the first silicon oxide layer 301, the first silicon nitride layer 302, the first silicon oxide layer 303, the second silicon nitride layer 304, the third silicon oxide layer 305, and the third silicon nitride layer 306.

For the embodiment shown in FIG. 5 and FIG. 6, the first silicon oxide layer 301 is actually only a part of the multiple barrier layer 102, and the first silicon nitride layer includes a part of the multiple barrier layer 102 and a part of the buffer layer 103. That is, in the embodiments of the present application, both the silicon oxide layer and the silicon nitride layer may include only a part of the film structure of the multiple barrier layer 102, the buffer layer 103, the insulating layer, the interlayer dielectric layer, and the like, or a part of each of the two film layers may be reconstituted into one silicon nitride layer or one silicon oxide layer. In this present application, a refractive index and a thickness of silicon nitride layer and silicon oxide layer are changed to adjust the light transmittance of the light transmission area.

Specifically, in this present application, a refractive index of the silicon nitride layers is greater than a refractive index of the silicon oxide layers. The silicon oxide layers with lower refractive index is disposed on the silicon nitride layers with higher refractive index. The silicon oxide layers with lower refractive index may play a role of anti-reflection film, which may weaken a reflection of light when passing through different media and enhance the light transmittance through interference. In the embodiment shown in FIG. 5, the first silicon oxide layer is disposed on the base substrate layer, and the refractive index of the silicon oxide layers (including the first silicon oxide layer) is less than the refractive index of the base substrate layer, so that the lower refractive index film layer is located on the higher refractive index film layer to enhance the light transmittance.

For the first silicon nitride layer 302, the first silicon oxide layer 303, the second silicon nitride layer 304, and the third silicon oxide layer 305, in FIG. 5, the silicon oxide layers with the lower refractive index is located on the silicon nitride layers with the higher refractive index, and different silicon oxide layers may also increase the light transmittance. For the third silicon nitride layer, a refractive index of the third silicon nitride layer is greater than a refractive index of the planarization layer, which may also improve the light transmittance. Refractive index ranges of the film layers in the embodiment shown in FIG. 5 is shown in a table as follows:

TABLE 1

| Film layer | Refractive index |
|---|---|
| Base substrate layer | 1.45-1.65 |
| First silicon oxide layer | 1.38-1.48 |
| First silicon nitride layer | 1.70-1.97 |
| Second silicon oxide layer | 1.38-1.48 |
| Second silicon nitride layer | 1.70-1.97 |
| Third silicon oxide layer | 1.38-1.48 |
| Third silicon nitride layer | 1.70-1.97 |
| Planarization layer | 1.50-1.70 |

As may be seen from the table above, in this present application, the refractive index of the silicon oxide layers is less than the refractive index of the base substrate layer. Even if the silicon oxide layers include a plurality of different silicon oxide layers such as the first silicon oxide layer, the first silicon oxide layer, the third silicon oxide layer, etc., the refractive index ranges of these silicon oxide layers are identical. Similarly, for the silicon nitride layers, even if the silicon nitride layers include a plurality of different silicon nitride layers such as the first silicon nitride layer, the second silicon nitride layer, and the third silicon nitride layer etc., the refractive index ranges of these silicon nitride layers are also same.

It should be noted that, for the base substrate layer and the silicon oxide layers, although there is a certain overlap in the corresponding refractive index range, when actually preparing the display panel, the refractive index of the base substrate layer is generally set to be greater than the refractive index of the silicon oxide layers. That is, the refractive index of the first inorganic insulating sub-layer 201, the refractive index of the third inorganic insulating sub-layer 203, and the refractive index of the fifth inorganic insulating sub-layer 205 are less than the refractive index of the substrate. For example, when the refractive index of the silicon oxide layers (including the first inorganic insulating sub-layer, 201, the third inorganic insulating sub-layer 203, and the fifth inorganic insulating sub-layer 205) is set to 1.48, the refractive index range of the substrate (that is, the base substrate layer) needs to be in a range of 1.48-1.65, instead of a range of 1.45-1.65. In the table above, the silicon nitride layers having a greater refractive index than the silicon oxide layers may include the second inorganic insulating sub-layer 202, the fourth inorganic insulating sub-layer, 204, and the sixth inorganic insulating sub-layer. The silicon oxide layers and the silicon nitride layers are alternately stacked, and the silicon oxide layers are disposed adjacent to the base substrate layer 101.

When the refractive index of different films is adjusted, it is necessary to adjust a thickness of different films correspondingly, and the light transmittance may be increased, only by combining the refractive index and the thickness. Specifically, the inorganic insulating layer includes one or more low-refractive-index inorganic insulating sub-layers (that is, the silicon oxide layers) and one or more high-refractive-index inorganic insulating sub-layers (silicon nitride layers) alternately stacked. And the low-refractive-index inorganic insulating sub-layers are disposed adjacent to the substrate, and a refractive index of the high-refractive-index inorganic insulating sub-layers is greater than adjacent low-refractive-index inorganic insulating sub-layers. A thickness of the low-refractive-index inorganic insulating sub-layer (that is the silicon oxide layers) in the present application satisfies a following formulas: $d=(2k-1)\lambda/(4n)$, where k is a positive integer, and a value of k is determined according to a number of layers of the low-refractive-index inorganic insulating sub-layers along a direction from the organic insulating layer to the substrate (for example, in the above table of the present application, the silicon oxide layers include the first inorganic insulating sub-layer 201, the third inorganic insulating sub-layer 203, and the fifth inorganic insulating sub-layer 205, the value of k of the fifth inorganic insulating sub-layer 205 is 1, the value of k of the third inorganic insulating sub-layer 205 is 2, and the value of k of the first inorganic insulating sub-layer 201 is 3). $\lambda$ is a wavelength of light, which may be 380-780 nm, and n is the refractive index of each inorganic insulating sub-layer.

In a specific embodiment, the $\lambda$ may be 550 nm. At this time, the film thickness of the silicon oxide layers (including the first inorganic insulating sub-layer 201, the third inorganic insulating sub-layer 203, and the fifth inorganic insulating sub-layer 205) satisfies:

929 (2k−1)Å−955 (2k−1)Å, where k is a positive integer, Å is a unit of length, and 1 Å is 0.1 nm.

However, the silicon oxide layers and the silicon nitride layers in the present application may actually be a part of a functional layer in FIG. 1 or may be a combination of parts of two functional layers. Therefore, the film thickness of different silicon oxide layers in FIG. 5 is different, and the film thickness of different silicon nitride layers is also different. For the silicon oxide layers, although the film thickness of different silicon oxide layers meets the film thickness range of 929 (2k−1) Å−955 (2k−1) Å, the actual film thickness of different silicon oxide layers is also different.

Taking the display panel shown in FIG. 5 as an example, the first silicon oxide layer includes a part of the multiple barrier layer 102, and a film thickness of the first silicon oxide layer may be in particular 650 nm-695 nm. The silicon oxide layer may include a part of the buffer layer and a part of the first insulating layer, and a film thickness of the silicon oxide layer may be 465 nm-495 nm. The third silicon oxide layer may include a part of the first interlayer dielectric layer, a third insulating layer, and a part of the second interlayer dielectric layer, and a film thickness of the third silicon oxide layer may be from 275 nm to 295 nm.

For the silicon nitride layers, the first silicon nitride layer includes a part of the multiple barrier layer 102 and a part of the buffer layer 103. A film thickness of the first silicon nitride layer may be in a range of 0 nm-100 nm. The second silicon nitride layer may include a part of the second insulating layer and a part of the first interlayer dielectric layer. A film thickness of the second silicon nitride layer may be in a thickness range of 0 nm-280 nm. The third silicon nitride layer may include a part of the second interlayer dielectric layer. A film thickness of the third silicon nitride layer may be in a range of 0 nm-200 nm. An overall thickness of the planarization layer or the organic insulating layer may be in a range of 7 um-8 um. An overall thickness of the base substrate layer or the substrate may be in a range of 12 um-16 um.

Figure 7:
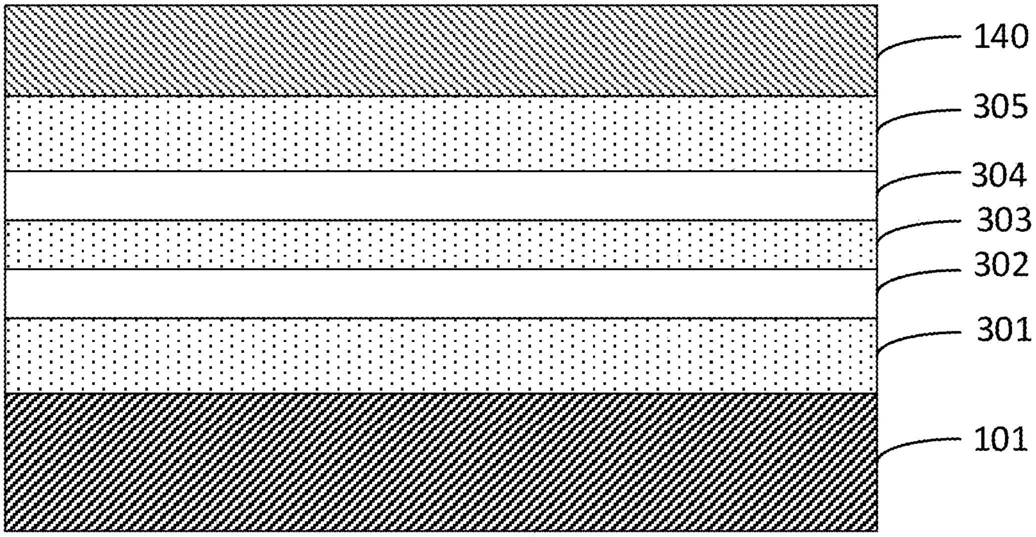
FIG. 7 is a structural schematic diagram of another embodiment of the display panel provided by an embodiment of the present application.
Figure 8:
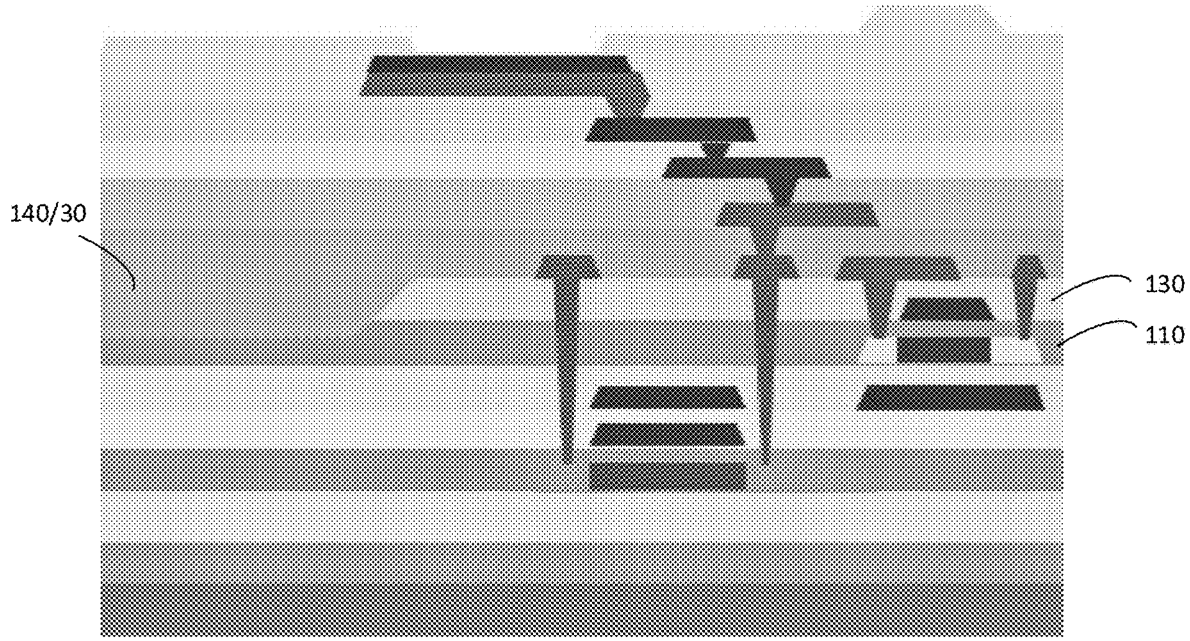
FIG. 8 is a structural schematic diagram of another embodiment of the display panel provided by an embodiment of the present application.

As shown in FIG. 7, FIG. 7 is a structural schematic diagram of another embodiment of the display panel provided by an embodiment of the present application. FIG. 8 is a structural schematic diagram of another embodiment of the display panel provided by an embodiment of the present application. Referring to FIG. 7 and FIG. 8, at this time, the display panel also includes the base substrate layer 101 and the planarization layer 140, and the inorganic insulating layer at this time also has a multi-film structure including the plurality of silicon oxide layers and the plurality of silicon nitride layers. However, unlike the embodiment shown in FIG. 5, the inorganic insulating layer at this time includes the first silicon oxide layer 301, the first silicon nitride layer 302, the second silicon oxide layer 303, the second silicon nitride layer 304, and the third silicon oxide layer 305 which are stacked from bottom to top. The first silicon oxide layer 301 is likewise disposed on the base substrate layer 101 and in direct contact with the base substrate layer 101.

In the embodiment shown in FIG. 7 and FIG. 8, the third silicon nitride layer is not existed, but on a basis of the embodiment shown in FIG. 5 and FIG. 6, a hole digging operation is performed to dig out the third silicon nitride layer and a part of the third silicon oxide layer to form a via hole in the light-transmission area. A bottom of the via hole is located above the third silicon oxide layer and is attached to an upper surface of the third silicon oxide layer. For the structure shown in FIG. 7 and FIG. 8, the second interlayer dielectric layer located in the light-transmitting area and part of the third insulating layer are removed. At this time, the bottom of the via hole is located inside the third insulating layer. After the via hole is formed, the via hole needs to be filled to ensure the overall safety and flatness of the display panel. In this present application, a material of the planarization layer (that is, the organic insulating layer) may be filled in the via hole, where the planarization layer above the third silicon oxide layer includes a part of the filled via hole.

At this time, the planarization layer is filled in the via hole. And since the third silicon oxide layer and part of the third silicon oxide layer are removed, the film thickness of the third silicon oxide layer in FIG. 8 is reduced. Specifically, the film thickness range of the third silicon oxide layer in FIG. 8 still ranges between 929 (2k−1) Å and 955 (2k−1) Å, but may be in a range of 275 nm-295 nm.

In the above embodiments, although the third silicon nitride layer and part of the third silicon oxide layer are removed, the first silicon oxide layer, the first silicon nitride layer, the first silicon oxide layer, the second silicon nitride layer, and part of the third silicon oxide layer still exists. Therefore, the light transmittance of the light-transmission area may still be increased by changing the refractive index and thickness of the film layers. And it should be noted that, the third oxide layer in the embodiment of FIG. 7 and FIG. 8 has been dug out a certain thickness, so the thickness is less than the thickness of the third oxide layer in the embodiment of FIG. 5 and FIG. 6. In this embodiment, the thickness of the third oxide layer may be 275 nm-295 nm.

The overall thickness of the planarization layer or the organic insulating layer may be in a range of 7 um-8 um. The overall thickness of the base substrate layer or the substrate may be in a range of 12 um-16 um.

Figure 9:
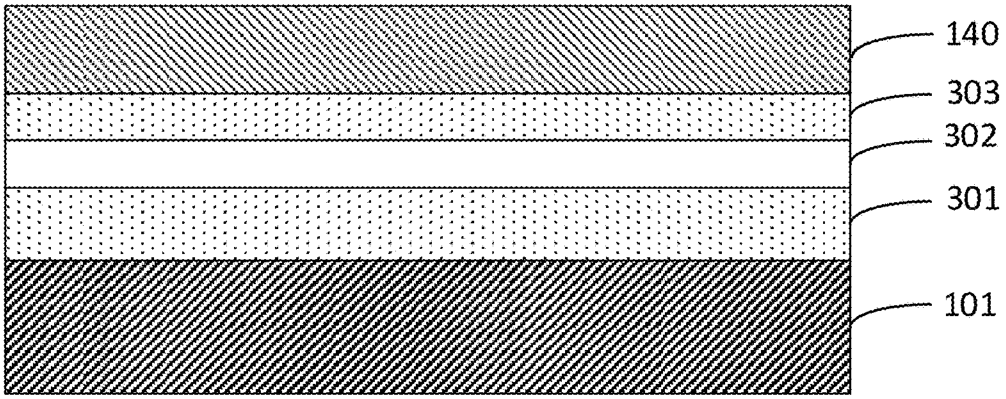
FIG. 9 is a structural schematic diagram of another embodiment of the display panel provided by an embodiment of the present application.
Figure 10:
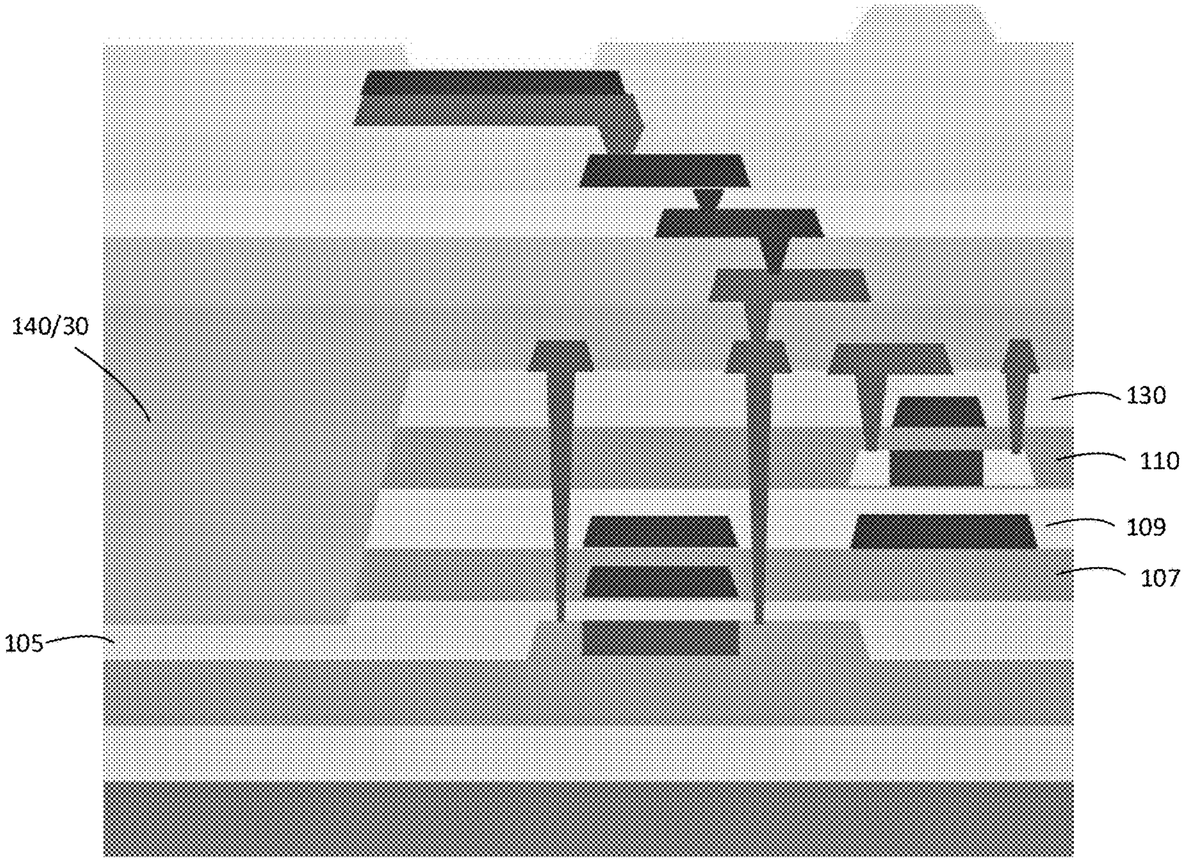
FIG. 10 is a cross-sectional diagram of another embodiment of a display panel provided by an embodiment of the present application.

As shown in FIG. 9, FIG. 9 is a structural schematic diagram of another embodiment of the display panel provided by an embodiment of the present application. FIG. 10 is a structural schematic diagram of another embodiment of the display panel provided by an embodiment of the present application. In the embodiment shown in FIG. 9 and FIG. 10, the inorganic insulating layer is also a multi-film layer structure. The silicon oxide layer includes the first silicon oxide layer 301 and the second silicon oxide layer 303. The silicon nitride layer includes the first silicon nitride layer 302. At this time, the inorganic insulating layer includes the first silicon oxide layer 301, the first silicon nitride layer 302, and the second silicon oxide layer 303 which are stacked from bottom to top.

In the embodiment shown in FIG. 9 and FIG. 10, a via hole is also formed in the light-transmission area of the display panel, and the bottom of the via hole is located above the silicon oxide layer and attached to the upper surface of the silicon oxide layer. The planarization layer also includes a part filled in the via hole. In the structure shown in FIG. 9 and FIG. 10, the second interlayer dielectric layer, the third insulating layer, the first interlayer dielectric layer, the second insulating layer, and part of the first insulating layer located in the light-transmitting area are removed at this time. At this time, a bottom of the via hole is located inside the first insulating layer.

Unlike the embodiment of FIG. 7 and FIG. 8, a depth of the via hole in FIG. 9 and FIG. 10 is greater than a depth of the via hole in the embodiment of FIG. 7 and FIG. 8. In the embodiment of FIG. 7 and FIG. 8, not only the entire third silicon nitride layer and the entire third silicon oxide layer are removed, but also the entire second silicon nitride layer and a part of the first silicon oxide layer are removed. Therefore, the film thickness of the silicon oxide layer in FIG. 9 and FIG. 10 is less than the film thickness of the silicon oxide layer in the embodiment of FIG. 7 and FIG. 8. In the structure shown in FIG. 9, the second interlayer dielectric layer, the third insulating layer, the first interlayer dielectric layer, the second insulating layer, and part of the first insulating layer located in the light-transmitting area are removed. Specifically, the film thickness of the silicon oxide layer in the embodiment of FIG. 9 and FIG. 10 is in a range of 275 nm-295 nm.

Figure 11:
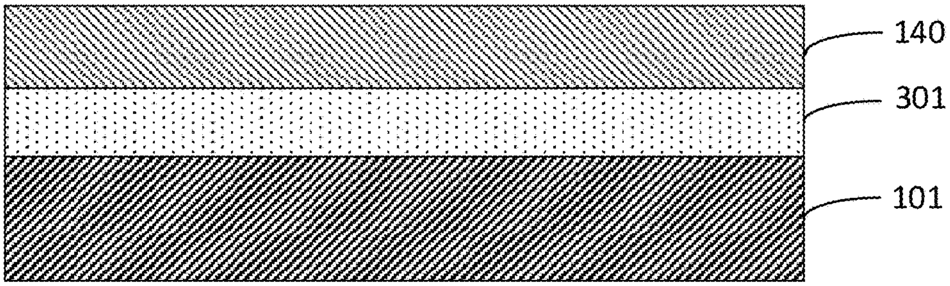
FIG. 11 is a structural schematic diagram of another embodiment of the display panel provided by an embodiment of the present application.
Figure 12:
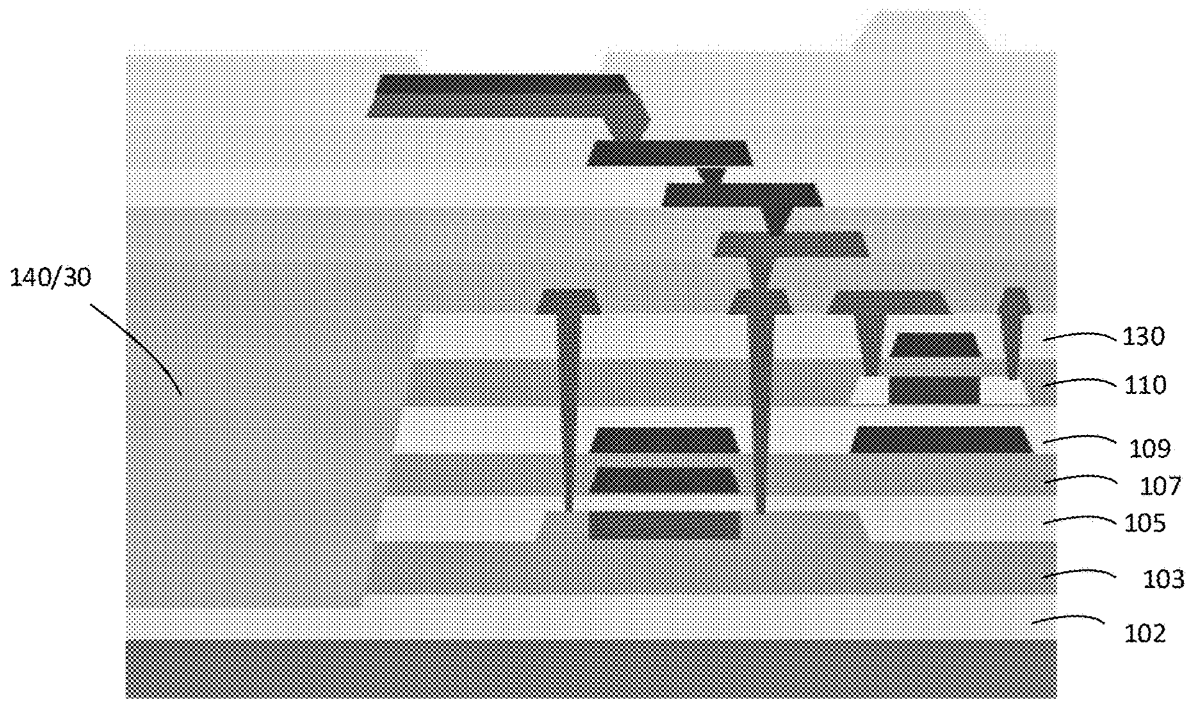
FIG. 12 is a cross-sectional diagram of another embodiment of a display panel provided by an embodiment of the present application.

As shown in FIG. 11, FIG. 11 is a structural schematic diagram of another embodiment of the display panel provided by an embodiment of the present application. FIG. 12 is a structural schematic diagram of another embodiment of the display panel provided by an embodiment of the present application. In the embodiment shown in FIG. 9 and FIG. 10, the inorganic insulating layer has a single film structure, that is, the inorganic insulating layer includes only one film layer, which is the first silicon oxide layer 301. At this time, the refractive index of the inorganic insulating layer is less than the refractive index of the base substrate layer 101. However, when the inorganic insulating layer includes the silicon oxide layers and silicon nitride layers overlapped, the refractive index of the whole inorganic insulating layer has no relationship with the refractive index of the base substrate layer. Instead, the refractive index of the silicon oxide layers in the inorganic insulating layer is less than the refractive index of the silicon nitride layers.

In the embodiment shown in FIG. 11 and FIG. 12, the inorganic insulating layer includes the first silicon oxide layer. The light-transmitting area of the display panel is also formed with a via hole, and a bottom of the via hole is attached to the upper surface of the first silicon oxide layer. And the planarization layer is filled in the via hole. In the structure shown in FIG. 11, the bottom of the via hole is located inside the multiple barrier layer 102. Different: from the embodiments above-mentioned, the first silicon nitride layer is removed in the embodiment of FIG. 11 and FIG. 12, the first silicon oxide layer, the second silicon nitride layer, the third silicon oxide, the third silicon nitride layer, and a part of the first silicon oxide layer. In the embodiment shown in FIG. 11 and FIG. 12, the thickness of the first silicon oxide layer is less than the thickness of the first silicon oxide layer in the embodiments above-mentioned. Specifically, the film thickness of the first silicon oxide layer ranges from 280 nm to 295 nm.

In the embodiments above-mentioned, the film thickness of the silicon oxide layer in the inorganic insulating layer is 929 (2k−1) Å-955 (2k−1) Å, regardless of whether the inorganic insulating layer is a single film layer or a multi-film layer structure. Only when digging via holes, part of the silicon oxide layers located in the light-transmitting area is excavated, so the actual thickness of different silicon oxide layers may be different. The thickness of silicon nitride layers is different, which can be set according to the actual situation.

The refractive index of the silicon nitride layers is greater than the refractive index of the silicon oxide layers. When the inorganic insulating layer includes only the first silicon oxide layer, the refractive index of the inorganic insulating layer (e.g., the first silicon oxide layer) is less than the refractive index of the base substrate layer 101. The refractive index of the planarization layer may be in the range of 1.45-1.65. The refractive index of the base substrate layer may be in the range of 1.50-1.70. When actually preparing the display panel, the refractive index of the planarization layer and the base substrate layer is generally controlled to be greater than 1.6. The base substrate layer 101 and the planarization layer in this present application are both transparent film layers made of an organic material so as to improve the light transmittance.

It should be noted that a division of the silicon oxide layers and the silicon nitride layers in this present application is mainly based on the preparation materials. The gate insulating layer, the planarization layer, and the like are divided according to actual functions. In this present application, there is a certain overlap among the silicon oxide layers, the silicon nitride layers, the insulating layer, the interlayer dielectric layer, and other functional layers. The via holes in this present application are all for the light-transmission area in the under-screen imaging area, and no opening operation is performed for the screen display area or the like in the display panel.

It should be noted that only the structure above-mentioned has been described in the display panel of the embodiments above-mentioned. It should be understood that in addition to the structure above-mentioned, any other necessary structure, such as a cathode layer, a pixel definition layer, etc., may be included in the display panel of the embodiments of the present application as required, and are not specifically limited herein.

The present application further provides a display device including any one display panel as described above. A specific structure of the display panel may refer to the above contents, which will not be described herein.

In the embodiments above-described, the description of each embodiment has its own emphasis and parts not detailed in one embodiment may be referred to above detailed description of other embodiments and will not be repeated herein.

In specific implementation, the above units or structures can be implemented as independent entities, and may further be arbitrarily combined to be implemented as the same or several entities. The specific implementation of the above units or structures may refer to the previous method embodiments, and will not be described herein.

The display panel and the display device provided by the embodiments of the present application are described in detail above, and the principle and implementation mode of the present application are described by using specific examples in this paper. The description about the foregoing embodiments is merely provided to help understand the method and core ideas of the present application. In addition, persons of ordinary skill in the art can make modifications in terms of the specific implementations and application scopes according to the ideas of the present application. Therefore, the content of this specification shall not be construed as a limit to the present application.

What is claimed is:

1. A display panel, comprising a first display area and a second display area, wherein a light transmittance of the first display area is greater than a light transmittance of the second display area, and the display panel further comprises:

a substrate;

an inorganic insulating layer, disposed on a side of the substrate;

a plurality of pixel-driving circuits, disposed on the inorganic insulating layer and comprising a plurality of first pixel-driving circuits disposed in the first display area or the second display area and a plurality of second pixel-driving circuits disposed in the second display area;

an organic insulating layer, disposed on a side of the inorganic insulating layer away from the substrate; and a light-emitting layer, disposed on a side of the organic insulating layer away from the substrate and comprising a plurality of first light-emitting pixels disposed in the first display area and a plurality of second light-emitting pixels disposed in the second display area, wherein the first pixel-driving circuits are electrically connected with the first light-emitting pixels, and the second pixel-driving circuits are electrically connected with the second light-emitting pixels;

wherein the inorganic insulating layer comprises a first inorganic insulating sub-layer, and a refractive index of the first inorganic insulating sub-layer is less than a refractive index of the substrate and less than a refractive index of the organic insulating layer;

wherein the inorganic insulating layer further comprises a second inorganic insulating sub-layer disposed between the first inorganic insulating sub-layer and the organic insulating layer, and a refractive index of the second inorganic insulating sub-layer is greater than the refractive index of the first inorganic insulating sub-layer;

wherein in the first inorganic insulating sub-layer, silicon nitride is disposed on silicon dioxide, and in the second inorganic insulating sub-layer, silicon dioxide is disposed on silicon nitride; and wherein the silicon dioxide in the first inorganic insulating sub-layer constitutes a first silicon oxide layer, and the silicon nitride in the first inorganic insulating sub-layer is in direct contact with the silicon nitride in the second inorganic insulating sub-layer to form a first silicon nitride layer; and wherein the first display area is formed with a via hole, the via hole penetrates the inorganic insulating layer, a bottom of the via hole is located inside the inorganic insulating layer, and the organic insulating layer is filled in the via hole.

2. The display panel according to claim 1, wherein the refractive index of the second inorganic insulating sub-layer is greater than the refractive index of the substrate and the refractive index of the organic insulating layer.

3. The display panel according to claim 1, wherein the inorganic insulating layer further comprises:

a third inorganic insulating sub-layer, disposed between the second inorganic insulating sub-layer and the organic insulating layer, and a refractive index of the third inorganic insulating sub-layer being less than the refractive index of the substrate, the refractive index of the second inorganic insulating sub-layer, and the refractive index of the organic insulating layer;

wherein in the third inorganic insulating sub-layer, silicon nitride is disposed on silicon dioxide, and the silicon dioxide in the second inorganic insulating sub-layer is in direct contact with the silicon dioxide in the third inorganic insulating sub-layer to form a second silicon oxide layer.

4. The display panel according to claim 3, wherein a thickness of the third inorganic insulating sub-layer is less than a thickness of the first inorganic insulating sub-layer.

5. The display panel according to claim 3, wherein the inorganic insulating layer further comprises:

a fourth inorganic insulating sub-layer, disposed between the third inorganic insulating sub-layer and the organic insulating layer, and a refractive index of the fourth inorganic insulating sub-layer being greater than the refractive index of the first inorganic insulating sub-layer and the refractive index of the third inorganic insulating sub-layer;

wherein in the fourth inorganic insulating sub-layer, silicon dioxide is disposed on silicon nitride, and the silicon nitride in the third inorganic insulating sub-layer is in direct contact with the silicon nitride in the fourth inorganic insulating sub-layer to form a second silicon nitride layer.

6. The display panel according to claim 5, wherein the refractive index of the fourth inorganic insulating sub-layer is less than the refractive index of the substrate, and greater than the refractive index of the organic insulating layer.

7. The display panel according to claim 5, wherein the refractive index of the first inorganic insulating sub-layer and the refractive index of the third inorganic insulating sub-layer are identical, and the refractive index of the second inorganic insulating sub-layer and the refractive index of the fourth inorganic insulating sub-layer are identical.

8. The display panel according to claim 5, wherein the inorganic insulating layer further comprises a fifth inorganic insulating sub-layer disposed between the fourth inorganic insulating sub-layer and the organic insulating layer;

wherein a refractive index of the fifth inorganic insulating sub-layer is less than the refractive index of the fourth inorganic insulating sub-layer; and wherein in the fifth inorganic insulating sub-layer, silicon nitride is disposed on silicon dioxide, and the silicon dioxide in the fourth inorganic insulating sub-layer is in direct contact with the silicon dioxide in the fifth inorganic insulating sub-layer to form a third silicon oxide layer.

9. The display panel according to claim 1, wherein the inorganic insulating layer comprises:

one or more low-refractive-index inorganic insulating sub-layers and one or more high-refractive-index inorganic insulating sub-layers alternately stacked, the low-refractive-index inorganic insulating sub-layers being disposed adjacent to the substrate, and a refractive index of the high-refractive-index inorganic insulating sub-layer being greater than a refractive index of the low-refractive-index inorganic insulating sub-layer adjacent to the high-refractive-index inorganic insulating sub-layer;

wherein a thickness of the low-refractive-index inorganic insulating sub-layer satisfies a following formulas: $d=(2k-1)\lambda/(4n)$;

where k is a positive integer, and a value of k is determined according to a number of layers of the low-refractive-index inorganic insulating sub-layers along a direction from the organic insulating layer to the substrate; $\lambda$ is a wavelength of light and n is a refractive index.

10. The display panel according to claim 1, wherein the first silicon oxide layer is in direct contact with the substrate.

11. A display device, comprising a sensor and a display panel comprising a first display area and a second display area, wherein a light transmittance of the first display area is greater than a light transmittance of the second display area, and the display panel further comprises:

a substrate;

an inorganic insulating layer, disposed on a side of the substrate;

a plurality of pixel-driving circuits, disposed on the inorganic insulating layer and comprising a plurality of first pixel-driving circuits disposed in the first display area or the second display area and a plurality of second pixel-driving circuits disposed in the second display area;

an organic insulating layer, disposed on a side of the inorganic insulating layer away from the substrate; and a light-emitting layer, disposed on a side of the organic insulating layer away from the substrate and comprising a plurality of first light-emitting pixels disposed in the first display area and a plurality of second light-emitting pixels disposed in the second display area, wherein the first pixel-driving circuits are electrically connected with the first light-emitting pixels, and the second pixel-driving circuits are electrically connected with the second light-emitting pixels;

wherein the inorganic insulating layer comprises a first inorganic insulating sub-layer, a refractive index of the first inorganic insulating sub-layer is less than a refractive index of the substrate and less than a refractive index of the organic insulating layer, and the sensor is disposed corresponding to the first display area of the display panel;

wherein the inorganic insulating layer further comprises a second inorganic insulating sub-layer disposed between the first inorganic insulating sub-layer and the organic insulating layer, and a refractive index of the second inorganic insulating sub-layer is greater than the refractive index of the first inorganic insulating sub-layer;

wherein in the first inorganic insulating sub-layer, silicon nitride is disposed on silicon dioxide, and in the second inorganic insulating sub-layer, silicon dioxide is disposed on silicon nitride; and wherein the silicon dioxide in the first inorganic insulating sub-layer constitutes a first silicon oxide layer, and the silicon nitride in the first inorganic insulating sub-layer is in direct contact with the silicon nitride in the second inorganic insulating sub-layer to form a first silicon nitride layer; and wherein the first display area is formed with a via hole, the via hole penetrates the inorganic insulating layer, a bottom of the via hole is located inside the inorganic insulating layer, and the organic insulating layer is filled in the via hole.

12. The display device according to claim 11, wherein the refractive index of the second inorganic insulating sub-layer is greater than the refractive index of the substrate and the refractive index of the organic insulating layer.

13. The display device according to claim 11, wherein the inorganic insulating layer further comprises:

a third inorganic insulating sub-layer, disposed between the second inorganic insulating sub-layer and the organic insulating layer, and a refractive index of the third inorganic insulating sub-layer being less than the refractive index of the substrate, the refractive index of the second inorganic insulating sub-layer, and the refractive index of the organic insulating layer;

wherein in the third inorganic insulating sub-layer, silicon nitride is disposed on silicon dioxide, and the silicon dioxide in the second inorganic insulating sub-layer is in direct contact with the silicon dioxide in the third inorganic insulating sub-layer to form a second silicon oxide layer.

14. The display device according to claim 13, wherein a thickness of the third inorganic insulating sub-layer is less than a thickness of the first inorganic insulating sub-layer.

15. The display device according to claim 13, wherein the inorganic insulating layer further comprises:

a fourth inorganic insulating sub-layer, disposed between the third inorganic insulating sub-layer and the organic insulating layer, and a refractive index of the fourth inorganic insulating sub-layer being greater than the refractive index of the first inorganic insulating sub-layer and the refractive index of the third inorganic insulating sub-layer;

wherein in the fourth inorganic insulating sub-layer, silicon dioxide is disposed on silicon nitride, and the silicon nitride in the third inorganic insulating sub-layer is in direct contact with the silicon nitride in the fourth inorganic insulating sub-layer to form a second silicon nitride layer.

16. The display device according to claim 15, wherein the refractive index of the fourth inorganic insulating sub-layer is less than the refractive index of the substrate, and greater than the refractive index of the organic insulating layer.

17. The display device according to claim 15, wherein the refractive index of the first inorganic insulating sub-layer and the refractive index of the third inorganic insulating sub-layer are identical, and the refractive index of the second inorganic insulating sub-layer and the refractive index of the fourth inorganic insulating sub-layer are identical.

18. The display device according to claim 15, wherein the inorganic insulating layer further comprises a fifth inorganic insulating sub-layer disposed between the fourth inorganic insulating sub-layer and the organic insulating layer;

wherein a refractive index of the fifth inorganic insulating sub-layer is less than the refractive index of the fourth inorganic insulating sub-layer; and wherein in the fifth inorganic insulating sub-layer, silicon nitride is disposed on silicon dioxide, and the silicon dioxide in the fourth inorganic insulating sub-layer is in direct contact with the silicon dioxide in the fifth inorganic insulating sub-layer to form a third silicon oxide layer.

19. The display device according to claim 11, wherein the inorganic insulating layer comprises:

one or more low-refractive-index inorganic insulating sub-layers and one or more high- refractive-index inorganic insulating sub-layers alternately stacked, the low-refractive-index inorganic insulating sub-layers being disposed adjacent to the substrate, and a refractive index of the high-refractive-index inorganic insulating sub-layer being greater than a refractive index of the low-refractive-index inorganic insulating sub-layer adjacent to the high-refractive-index inorganic insulating sub-layer;

wherein a thickness of the low-refractive-index inorganic insulating sub-layer satisfies a following formulas: $d=(2k-1)\lambda/(4n)$;

where k is a positive integer, and a value of k is determined according to a number of layers of the low-refractive-index inorganic insulating sub-layers along a direction from the organic insulating layer to the substrate; λ is a wavelength of light and n is a refractive index.

* * * * *